US012725652B2

(12) United States Patent
Makabe

(10) Patent No.: US 12,725,652 B2
(45) Date of Patent: Sep. 1, 2026

(54) APPARATUS FOR SMALL SWING DATA TRANSFER

(71) Applicant: MICRON TECHNOLOGY, INC., Boise, ID (US)

(72) Inventor: Harutaka Makabe, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 18/747,986

(22) Filed: Jun. 19, 2024

(65) Prior Publication Data

US 2025/0078909 A1 Mar. 6, 2025

Related U.S. Application Data

(60) Provisional application No. 63/579,204, filed on Aug. 28, 2023.

(51) Int. Cl.

| | |
|---|---|
| ***G11C 11/409*** | (2006.01) |
| ***G11C 11/4074*** | (2006.01) |
| ***G11C 11/4093*** | (2006.01) |
| ***G11C 11/4096*** | (2006.01) |

(52) U.S. Cl.

CPC ...... *G11C 11/4096* (2013.01); *G11C 11/4074* (2013.01); *G11C 11/4093* (2013.01)

(58) Field of Classification Search

CPC ............ G11C 11/4096; G11C 11/4074; G11C 11/4093

See application file for complete search history.

(56) References Cited

U.S. PATENT DOCUMENTS

| | | | | |
|---|---|---|---|---|
| 11,403,241 B2 * | 8/2022 | Hasbun | G11C 7/1069 | |
| 2004/0047404 A1 * | 3/2004 | Kim | G11C 7/1051 | 375/211 |
| 2009/0153262 A1 * | 6/2009 | Kang | H04B 1/48 | 333/100 |
| 2009/0261865 A1 * | 10/2009 | Pasqualini | H03K 19/018521 | 327/108 |

(Continued)

OTHER PUBLICATIONS

Zhang , et al., ""Low-Swing Interconnect Interface Circuits"", ISLPED '98: Proceedings of the 1998 international symposium on Low power electronics and designAug. 1998pp. 161-166.

*Primary Examiner* — Khamdan N. Alrobaie
(74) *Attorney, Agent, or Firm* — Dorsey & Whitney LLP

(57) ABSTRACT

Embodiments of the disclosure provide an apparatus comprising a small swing driver and a small swing repeater on data transfer wiring of a memory device. The small swing driver includes 1st pair of 1st-type p/n-MOS transistors and 2nd pair of 2nd-type p/n-MOS transistors. The small swing repeater includes 3rd pair of 1st-type p/n-MOS transistors and 4th pair of 2nd-type p/n-MOS transistors. In the small swing driver, positive power supply voltage and 1st step-down power supply voltage are applied to gate and source of 2nd-type p-MOS transistor of 2nd pair, and 2nd step-down power supply voltage is applied to 2nd-type p-MOS transistor of 2nd pair as backbias voltage. In the small swing repeater, 1st and 2nd step-down power supply voltages are applied to source and gate of 2nd-type p-MOS transistor of 4th pair. 2nd step-down power supply voltage is also applied to 2nd-type p-MOS transistor of 4th pair as backbias voltage.

20 Claims, 9 Drawing Sheets

(56) References Cited

U.S. PATENT DOCUMENTS

| | | | | |
|---|---|---|---|---|
| 2012/0250387 | A1* | 10/2012 | Kondo | G11C 11/409 365/51 |
| 2014/0286112 | A1* | 9/2014 | Ide | G11C 7/106 365/194 |
| 2021/0263671 | A1* | 8/2021 | O | H01L 25/0652 |
| 2024/0203980 | A1* | 6/2024 | Cho | H10D 89/611 |
| 2025/0096214 | A1* | 3/2025 | Chung | H01L 23/5389 |

* cited by examiner 300 (Standby)
Small Swing Driver 301 (OFF)
Small Swing Repeater 302
Small Swing Repeater 303
Level Shifter 304
IN301
OUT301
OUT302
OUT303
OUT304
RWBUS
Hiz

APPARATUS FOR SMALL SWING DATA TRANSFER

CROSS REFERENCE TO RELATED APPLICATION(S)

This application claims the benefit under 35 U.S.C. § 119 of the earlier filing date of U.S. Provisional Application Ser. No. 63/579,204 filed Aug. 28, 2023, the entire contents of which are hereby incorporated by reference in its entirety for any purpose.

BACKGROUND

High data reliability, high speed of memory access, lower power consumption, and reduced chip size are features that are demanded from a semiconductor memory. A three-dimensional (3D) memory device may be formed by stacking a plurality of memory dies (or memory chips) vertically and interconnecting the stacked memory dies using a plurality of through-silicon vias (TSVs). Benefits of the 3D memory device include shorter interconnects which reduce signal delays and power consumption, a larger number of vertical vias between layers which allow wide bandwidth buses between functional blocks in different layers, and a considerably smaller footprint. Thus, the 3D memory device contributes to higher memory access speed, lower power consumption, and chip size reduction. Example 3D memory devices include a High Bandwidth Memory (HBM) and a Hybrid Memory Cube (HMC). HBM is a type of memory including a high-performance dynamic random access memory (DRAM) interface die and vertically stacked DRAM dies. HMC is another type of such memory.

In some instances, a 3D memory device, such as an HBM, may require a wiring for data transfer repeatedly routed multiple times. Such wiring may include a data read and write bus (RWBUS). The long-distance wiring as well as associated drivers, receiver circuits, and such accounts for a greater portion of consumption of current in data read and write operations.

Transferring data through the long-distance wiring with small voltage swing is effective in reducing the current consumption for the read and write operations. However, the small swing data transfer uses level shifter circuits (or level converter circuits) and/or amplifier circuits for transitioning the data transfer wiring to a power supply voltage level, and these circuits consume current themselves. This affects the current consumption reduction and hence energy saving of small swing.

Therefore, there is a demand for a technique to further effectively reduce current consumption during data transfer using the long-distance wiring, such as RWBUS, for read and write operations of a memory device.

DETAILED DESCRIPTION

Figure 1:
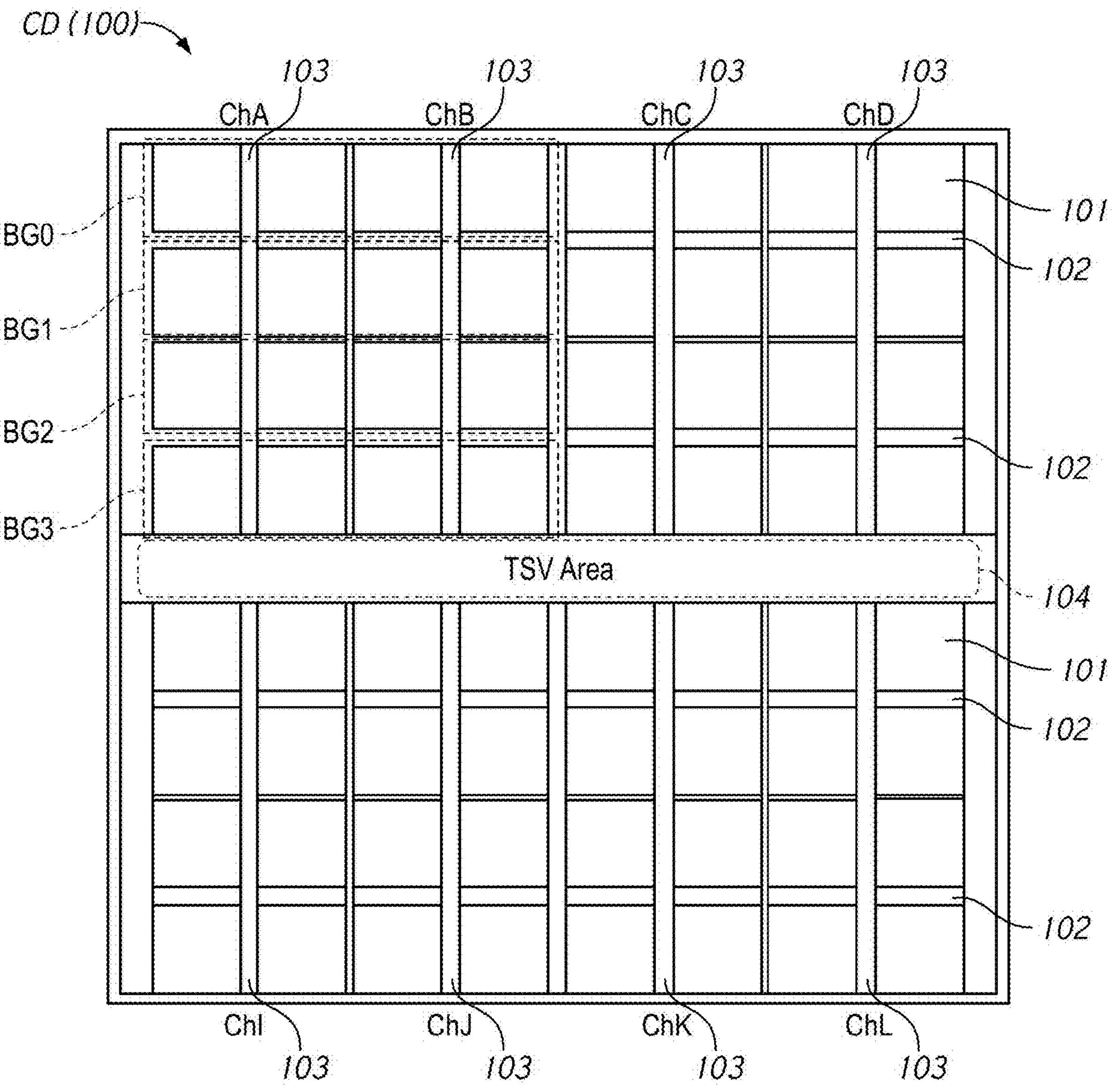
FIG. 1 is a schematic diagram of an example of at least part of a core die CD of a memory device in a plan view according to an embodiment of the disclosure.

Various example embodiments of the disclosure will be described below in detail with reference to the accompanying drawings. The following detailed descriptions refer to the accompanying drawings that show, by way of illustration, specific aspects in which embodiments of the disclosure may be practiced. These embodiments are described in sufficient detail to enable those skilled in the art to practice the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

In the descriptions, common or related elements and elements that are substantially the same are denoted with the same signs, and the descriptions thereof may be reduced or omitted. In the drawings, some of the same signs may be omitted for the same or substantially the same elements for case of illustration. In the drawings, the dimensions and dimensional ratios of each unit do not necessarily match the actual dimensions and dimensional ratios in the embodiments.

FIG. 1 is a schematic diagram of an example of at least part of a core die CD of a memory device 100 in a plan view according to an embodiment of the disclosure. The core die CD includes a plurality of memory bank groups BG. In the example, only four bank groups BG0-BG3 are indicated for case of illustration, but the number of bank groups is not limited thereto. Each bank group BG includes a plurality of memory cells 101 arranged in array or matrix in cell array regions. The core die CD may be one of a plurality of core dies CDs stacked with one another on a logic die. The logic die may include an interface die. The logic die may be coupled to an interposer via external terminals. The memory device 100 may be a DRAM. In some embodiments of the disclosure, the memory device 100 may be a high bandwidth memory (HBM) or a hybrid memory cube (HMC). The memory device 100 is one example of a semiconductor device. The memory device 100 may have different arrangements of memory bank groups and memory cells as well as various regions, areas, channels, and the like than the illustrated example as appropriate.

The stacked core dies CDs of the memory device 100 may be coupled with each other and with the logic die via a plurality of through-silicon vias (TSVs). The TSVs may be provided in peripheral regions besides the cell array regions. One of the peripheral regions may be at a central region (indicated as "TSV Area" in the drawing) 104 of the core die CD where the cell array regions are not provided in a plan view. TSVs may also be provided in other peripheral regions. TSVs may be spiral TSVs. There may also be provided logic circuits, buffers, and such coupled to the TSVs in the TSV Area 104. Between the memory cells 101 in one direction (e.g., left-right in FIG. 1) are bank logic areas 102. There are also data sense amplifier (DSA) areas 103 between the memory cells 101 extending in another direction (e.g., up-down in FIG. 1). The term "coupled" herein may include "connected."

There may be a plurality of data read and write buses (RWBUSs or simply RWBUS) as data transfer wirings running from the memory cells 101 to the DSA areas 103 in each bank group BG and/or for each channel Ch. RWBUS may include, for example, global input/output (GIO) lines. The DSA areas 103 may include circuits that convert RWBUS to a power supply level, such as a positive power supply voltage VDD level. There may also be a plurality of RWBUS from the TSVs in the TSV area 104 to the circuits in the DSA areas 103. Each RWBUS may carry, for example, read/write (RW) data or input/output (IO) signals.

Figure 2:
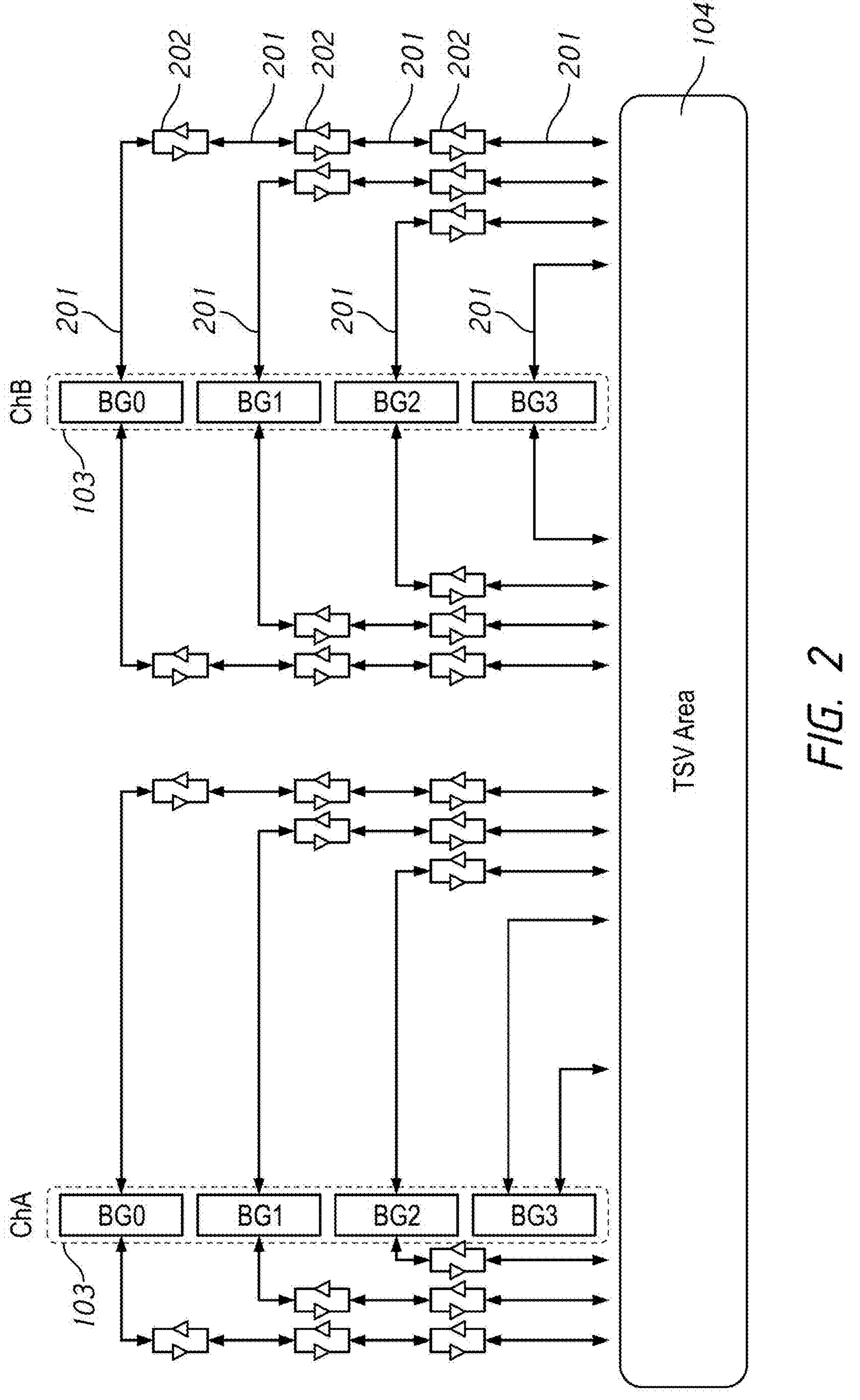
FIG. 2 depicts an example of I/O signal paths between a data sense amplifier area and a TSV area according to an embodiment of the disclosure.

FIG. 2 depicts an example of IO signal paths 201 between the DSA areas 103 and the TSV area 104 according to an embodiment of the disclosure. Since RWBUS from the TSV area 104 become longer to the bank groups BGs located farther from the TSV area 104, one or more repeater circuits (or simply referred to as repeaters) 202 are provided on RWBUS to extend the IO signal paths 201. For example, while RWBUS to the circuits in the DSA area 103 of BG3 located closest to the TSV area 104 may be the shortest, RWBUS to the DSA areas 103 of BG2 and BG1 may be longer and RWBUS to the DSA area 103 of BG0 located farthest from the TSV area 104 may be the longest. Because of such a longer distance, the one or more repeaters 202 are provided on RWBUS along IO signal paths 201 between the TSV area 104 and the DSA areas 103 of BG0-BG2 among the four memory banks in the illustrated example. The repeaters 202 may be small swing repeaters. Such repeaters may be referred to as RWBUS repeaters herein.

The repeaters 202 may be turned on and stay in the ON state when and where necessary. In the illustrated example, when BG2 is accessed for data read/write, the repeaters 202 on RWBUS coupling the TSV area 104 and BG2 are turned on while the repeaters 202 on RWBUS coupling the TSV area 104 and BG0 and BG1 are turned off. When BG0 is accessed, the repeaters 202 on RWBUS coupling the TSV area 104 and BG0 are turned on while the repeaters 202 provided on RWBUS coupling the TSV area 104 and BG1 and BG2 are turned off. A driver may be provided to control each repeater 202 with a column command of each bank group BG. A driver and repeaters together may form a single-directional buffer and/or a bi-directional buffer on RWBUS. Such buffer may also include a level shifter arranged after the repeaters.

According to some embodiments of the disclosure, during the state where some of the RWBUS repeaters are turned off, off-leakage of the turned-off RWBUS repeaters may be suppressed by using a step-down power voltage, that is a voltage stepped down from a power supply voltage. Such state may include a standby state. This effectively reduces the overall current consumption.

Some embodiments of the disclosure utilize a small swing driver that uses a power supply voltage (herein may also be referred to as $V_{peri\text{-}bus}$ or VPERBS) stepped down from a positive supply voltage VDD to drive the RWBUS repeaters.

The small swing driver as well as the repeater(s) may include one or more transistors of low threshold voltage Vt (herein may also be referred to as Low Vt transistors). Some embodiments of the disclosure improve off-leakage by controlling at least one of a gate voltage and a back bias voltage of each Low Vt transistor using another power supply voltage (herein may also be referred to as $V_{nwell\text{-}bus}$ or VNWBS) stepped down from VDD, which is different from VPERBS. For example, VPERBS and VNWBS each have a voltage value less than VDD, and VNWBS has a voltage value greater than VPERBS. This further effectively reduces the consumption of current, such as a standby current. In some embodiments, VNWBS may have a voltage value less than internal voltages/potentials such as VPP generated by an internal voltage generator circuit based on the power supply voltage such as VDD. As one example, VPP may be 1.8V and VDD 1.1V. In such a case, the voltage value of VNWBS is set to be less than VDD or higher power (e.g., VPP).

The small swing driver and the repeater(s) arranged on RWBUS according to one or more embodiments of the disclosure hence use the two step-down power supply voltages VPERBS and VNWBS in addition to VDD to effectively improve the current consumption reduction.

Figure 3:
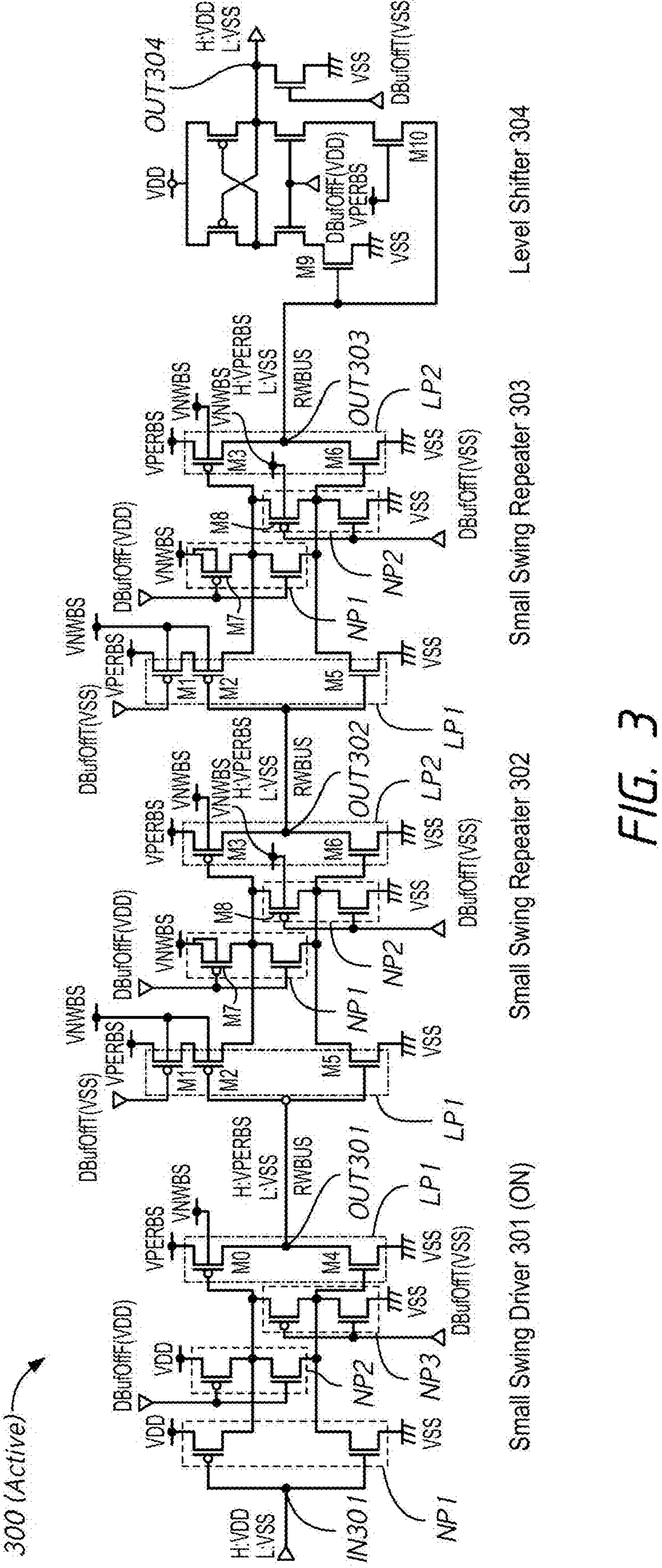
FIGS. 3 and 4 are circuit diagrams of an example of an apparatus according to an embodiment of the disclosure.
Figure 4:
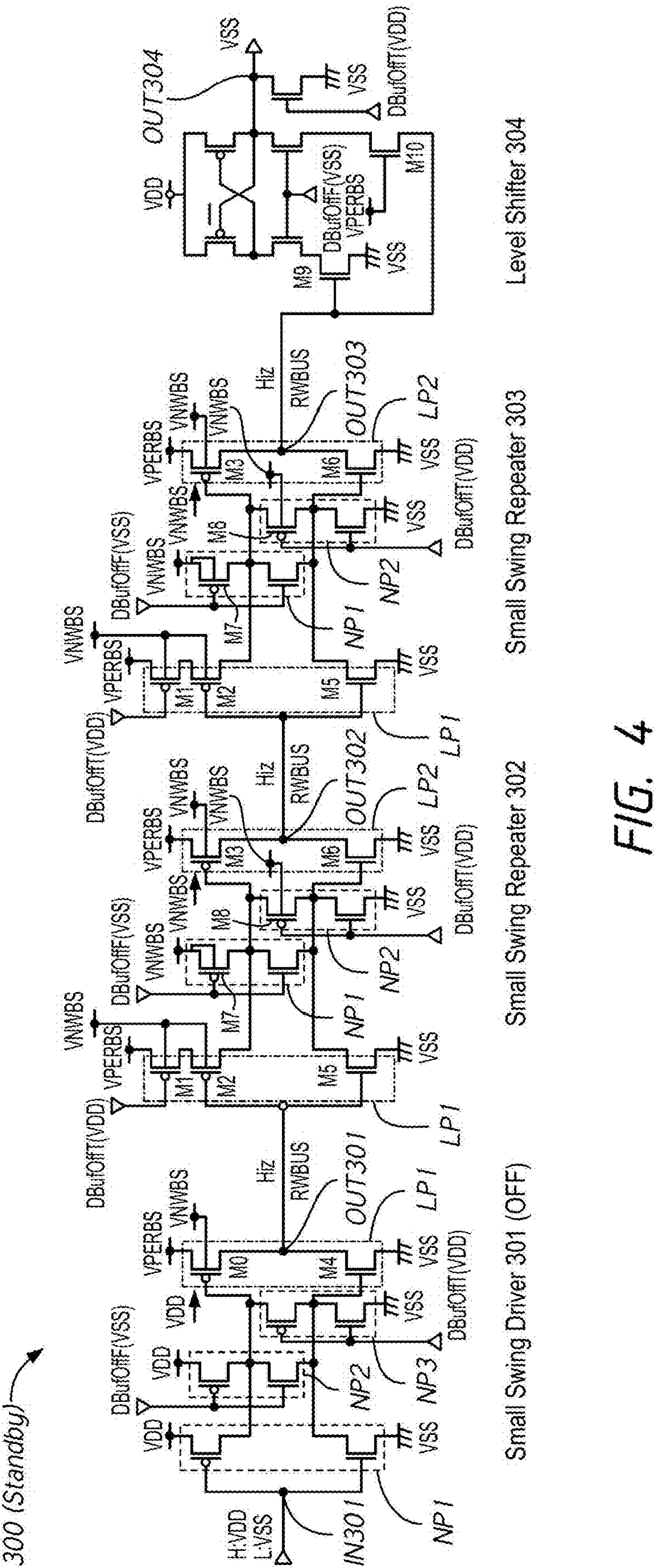

FIGS. 3 and 4 are circuit diagrams of an example of an apparatus 300 according to an embodiment of the disclosure. The example circuit diagram in FIG. 3 is of an active state (or an active mode) where a driver circuit, such as a small swing driver, that controls repeater circuits of RWBUS is turned on when one or more bank groups are accessed during a read operation or a write operation of a memory device. The example circuit diagram in FIG. 4 is of a standby state (or a standby mode) where the driver circuit, such as the small swing driver, is turned off when one or more bank groups are not accessed. There may be some other instances when the driver circuit is turned off and stays in the standby state. The apparatus 300 includes a small swing driver 301, a first small swing repeater 302, a second small swing repeater 303, and a level shifter 304 which are coupled to a target RWBUS in that order from an upstream side to a downstream side (from left to right in FIGS. 3 and 4) of RWBUS. In some embodiments of the disclosure, the apparatus 300 may be included in a core die CD of a memory device, for example, the memory device 100 of FIG. 1. RWBUS may be arranged between a peripheral region (such as the TSV Area 104) and a cell array region of the core die CD of the memory device 100 in FIG. 1. RWBUS may couple TSV, buffers, circuits, or the like arranged in the peripheral region with one or more bank groups arranged in the cell array region. The active state and the standby state may be controlled by one or more signals assigned for each bank group BG and/or each channel Ch of the memory device 100. In some embodiments of the disclosure, the apparatus 300 may be included in one or more IO signal paths, for example, IO signal paths 201 of FIG. 2.

Referring to FIG. 3, the small swing driver 301 is a complementary MOS (CMOS) driver including one or more pairs of a p-MOS transistor and an n-MOS transistor. A pair of the p-MOS transistor and n-MOS transistor has a lower threshold voltage Vt than the other pair of p-MOS transistor and n-MOS transistor. In some embodiments of the disclosures, the pair of the p-MOS transistor and n-MOS transistor has a threshold voltage Vt of, for example, 230 mV, and the other pair of p-MOS transistor and n-MOS transistor has a threshold voltage Vt of, for example, 100 mV. The pair of p-MOS transistor and n-MOS transistor having the higher threshold voltages Vt may be referred to as Normal Vt p-MOS and n-MOS transistors or collectively as Normal Vt MOS transistor(s). The pair of p-MOS transistor and n-MOS transistor having the lower threshold voltages Vt may be referred to as Low Vt p-MOS and n-MOS transistors or collectively as Low Vt MOS transistor(s). In some embodiments, Vt of the Low Vt MOS transistor may have a broader temperature gradient so that the Low Vt MOS transistor can operate under a further lower Vt condition, for example at a higher temperature, by giving VPERBS and VNWBS a temperature slope. For example, threshold voltages of MOS transistors have different temperature gradients depending on devices. In the case of the low voltage operation of the Low Vt MOS transistor in a certain HBM, Vt of the Low Vt MOS transistor varies about −1.0 mV/deg C. The temperature gradient of such Vt may be, therefore, set to be the same level as the above range.

Herein, the Normal Vt MOS transistors may be referred to as first-type MOS transistors, and Low Vt MOS transistors may be referred to as second-type MOS transistors. In the illustrated example, the small swing driver (or the CMOS driver) 301 includes: three pairs NP1, NP2, NP3 of Normal Vt p-MOS and n-MOS transistors; and one pair LP1 of Low Vt p-MOS and n-MOS transistors (denoted as M0 and M4 in the drawing, respectively) arranged after the third Normal Vt MOS transistor pair on the downstream side of the driver circuit.

The small swing driver 301 receives a positive power supply voltage VDD (or CMOS VDD) as an upper voltage (H) and a ground or negative power supply voltage VSS as a lower voltage (L), and uses a first power supply voltage VPERBS stepped down from VDD and a second power supply voltage VNWBS also stepped down from VDD for the Low Vt p-MOS transistor M0. In other words, the small swing driver 301 uses three upper voltages VDD, VPERBS, and VNWBS. In some embodiments of the disclosure, VDD may be 1.1V, VPERBS may be 0.6V, and VNWBS may be 0.9V. VSS may be 0V. The small swing driver 301 receives an input signal at input node IN301 coupled to gates of the Normal Vt p-MOS and n-MOS transistors of the first pair NP1. A high logic level input signal at node IN301 has a voltage of VDD, and a low logic level input signal at node IN301 has a voltage of VSS. VDD is applied to a source of each of Normal Vt p-MOS transistors. VPERBS is applied to a source of the Low Vt p-MOS transistor MO. VNWBS is applied to the Low Vt p-MOS transistor M0 as a backbias (or back-bias) voltage. The small swing driver 301 also receives a control signal or gate control voltage DBufOffF at gates of the Normal Vt p-MOS and n-MOS transistors of the second pair, and a control signal or gate control voltage DBufOffT at gates of the Normal Vt p-MOS and n-MOS transistors of the third pair.

The first small swing repeater 302 is coupled to the RWBUS, and includes a first pair NP1 of Normal Vt p-MOS and n-MOS transistors and a second pair NP2 of Normal Vt p-MOS and n-MOS transistors. The first small swing repeater 302 also includes a first pair LP1 of Low Vt p-MOS and n-MOS transistors M2 and M5 on the upstream side of the repeater circuit before the first Normal Vt MOS transistor pair NP1, and a second pair LP2 of Low Vt p-MOS and n-MOS transistors M3 and M6 on the downstream side of the repeater circuit after the second Normal Vt MOS transistor pair NP2. The first pair LP1 of Low Vt p-MOS and n-MOS transistors M2 and M5 receive an input signal from an output node OUT301 of the small swing driver 301. The first small swing repeater 302 further includes an additional Low Vt p-MOS transistor M1 coupled to the Low Vt p-MOS transistor M2. The first small swing repeater 302 differs from the small swing driver 301 in that the Low Vt MOS transistor (M2, M5) pair LP1 is provided in place of the first Normal Vt MOS transistor pair NP1 of the driver circuit and that the additional Low Vt p-MOS transistor M1 is provided in the same transistor stage as the Low Vt MOS transistor (M2, M5) pair LP1 at the upstream side of the repeater circuit.

VPERBS (e.g., 0.6V) is applied to a source of each of the Low Vt p-MOS transistors M1 and M3. The first small swing repeater 302 also receives VNWBS (e.g., 0.9V) at each of the Low Vt p-MOS transistors M1, M2, and M3 as a backbias voltage. VNWBS is also applied to the Normal Vt p-MOS transistor M7 at its source and as its backbias voltage. VNWBS is further applied to the Normal Vt p-MOS transistors M8 as a backbias voltage. The $V_{nwell}$ or the backbias voltages of all of the Low Vt p-MOS transistors M1, M2, M3 and the Normal Vt p-MOS transistors M7 and M8 (which are directly coupled to at least gates and/or sources of the Low Vt p-MOS transistors) as well as the source power supply of the Normal Vt p-MOS transistor M7 use the common VNWBS power supply. The first small swing repeater 302 further receives DBufOffF at gates of the Normal Vt p-MOS and n-MOS transistors of the first pair NP1 (which correspond to the Normal Vt p-MOS and n-MOS transistors of the second pair NP2 in the small swing driver 301), and DBufOffT at gates of the Normal Vt p-MOS and n-MOS transistors of the second pair NP2 (which correspond to the Normal Vt p-MOS and n-MOS transistors of the third pair NP3 in the small swing driver 301). In the first small swing repeater 302, DBufOffT is also provided at a gate of the Low Vt p-MOS transistor M1.

The second small swing repeater 303, arranged after the first small swing repeater 302 on the same RWBUS, has the same circuit configuration as the first small swing repeater 302. VPERBS and VNWBS as well as DBufOffT (VDD) and DBufOffT (VSS) are provided to the respective transistors of the second small swing repeater 303 in the same manner as those provided to the first small swing repeater 302. While the apparatus 300 includes the two small swing repeaters 302 and 303 in the illustrated example, the number of the repeaters is not limited thereto. For example, there may be one repeater or three or more repeaters depending on, for example, the distance or length of RWBUS.

The level shifter 304 arranged after the second small swing repeater 303 on the same RWBUS. The level shifter 304 is provided an output signal from an output node OUT303 of the second small swing repeater 303 on the RWBUS. In some embodiments of the disclosure, the level shifter 304 has a circuit configuration as a conventional level shifter. In response to DBufOffT (VDD) and DBufOffF (VSS) at gates of the Normal Vt n-MOS transistors, the level shifter 304 shifts or translates the voltage swing between VPERBS and VSS of an input signal on the RWBUS, which is coupled to a gate of a first Low Vt n-MOS transistor M9 and a source of a second Low Vt n-MOS transistor M10 thereof, to a voltage swing between VDD and VSS for an output signal provided at output node OUT304.

In this circuit configuration, the apparatus 300 uses the step-down power supply voltages VPERBS and VNWBS as the source power supply and the backbias voltages at least for the respective Low Vt p-MOS transistors, and achieves the small swing data transfer without transitioning RWBUS to the VDD/VSS level at the driver 301 and the repeaters 302 and 303. The RWBUS only transitions to the VDD/VSS level at the level shifter 304.

The small swing driver 301, first and second small swing repeaters 302 and 303, and the level shifter 304 are activated by inactive DBufOffT and DBufOffF signals (e.g., low logic level DBufOffT signal (VSS) and high logic level DBufOffF signal (VDD)). The small swing driver 301, first and second small swing repeaters 302 and 303, and the level shifter 304 are deactivated by active DBufOffT and DBufOffF signals (e.g., high logic level DBufOffT signal (VDD) and low logic level DBufOffF signal (VSS)).

Referring back to FIG. 3, in the active state, the DBufOffT and DBufOffF signals are inactive (e.g., VSS and VDD, respectively). As previously described, the inactive DBufOffT and DBufOffF signals activate the small swing driver 301, the first and second small swing repeaters 302 and 303, and the level shifter 304.

When activated, the small swing driver 301 provides an output signal from node OUT301 on the RWBUS having an output voltage based on a logic level of the input signal at node IN301. For example, for an input signal at node IN301 having a high logic level, the small swing driver 301 provides a high logic level output signal at node OUT301 having a voltage of VPERBS; for an input signal at node IN301 having a low logic level, the small swing driver 301 provides a low logic level output signal at node OUT301 having a voltage of VSS. The voltage of a high logic level output signal at node OUT301 is lower than the voltage of a high logic level input signal at node IN301 (e.g., VPERBS<VDD), which provides a lower voltage swing between high and low logic levels of the output signal at node OUT301 compared to the voltage swing of the input signal at node IN301.

When activated, the first small swing repeater 302 provides an output signal at an output node OUT302 on the RWBUS having an output voltage based on a logic level of the output signal at node OUT301 from the small swing driver 301. For example, for an output signal at node OUT301 having a high logic level, the first small swing repeater 302 provides a high logic level output signal at node OUT302 having a voltage of VPERBS; for an output single at node OUT301 having a low logic level, the first small swing repeater 302 provides a low logic level output signal at node OUT302 having a voltage of VSS. The voltage of a high logic level output signal at node OUT302 is the same as the voltage of a high logic level output signal at node OUT301 (e.g., VPERBS), which maintains the lower voltage swing between high and low logic levels of the output signal at node OUT302.

The second small swing repeater 303 operates similarly to the first small swing repeater 302, providing an output signal at node OUT303 having a logic level based on the output signal at node OUT302 provided by the first small swing repeater 302. As with the first small swing repeater 302, the second small swing repeater 303 provides a high logic level output signal at node OUT303 having a voltage of VPERBS, and provides a low logic level output signal at node OUT303 having a voltage of VSS. In the small swing repeaters 302 and 303, the Low Vt p-MOS transistor M1 is always active or on while receiving an inactive DBufOffT (low: VSS) at its gate.

The level shifter 304 receives the output signal at node OUT303, and when activated, provides an output signal having a logic level based on the output signal at node OUT303 from the second small swing repeater 303. The level shifter 304 provides a high logic level output signal at node OUT304 having a voltage VDD when the output signal at node OUT303 has a high logic level (e.g., VPERBS voltage), and provides a low logic level output signal at node OUT304 having a voltage VSS when the output signal at node OUT303 has a low logic level (e.g., VSS voltage). As a result, an input signal at node IN301 provided to the small swing driver 301 having a voltage swing of VDD and VSS is transmitted over the RWBUS by the first and second small swing repeaters 303 and 303 with a lower voltage swing of VPERBS and VSS, and is then shifted to a higher voltage swing of VDD and VSS when output as the output signal at node OUT304 by the level shifter 304.

Referring to FIG. 4, in the standby state, the DBufOffT and DBufOffF signals are active (e.g., VDD and VSS, respectively). As previously described, the active DBufOffT and DBufOffF signals deactivate the small swing driver 301, the first and second small swing repeaters 302 and 303, and the level shifter 304. When the small swing driver 301 is deactivated, there may be a leak current that flows between the Low Vt p-MOS transistor M0 and the Low Vt n-MOS transistor M4. To reduce the off-leakage, VNWBS (e.g., 0.9V) is designed to have a process dependency and to have a voltage value greater than VPERBS (e.g., 0.6V) as a backbias voltage. This way, the leakage at the Low Vt p-MOS transistor M0 is effectively suppressed.

In addition, when deactivated, the small swing driver 301, and the first and second small swing repeaters 302 and 303 have a high-impedance state (HiZ) at the respective output nodes. That is, RWBUS becomes HiZ. In such a state, there may be a leak current from VNWBS to VPERBS at the Low Vt p-MOS transistor M2, which causes an increase of the standby current. However, in the circuit configuration according to the present embodiment, the Low Vt p-MOS transistor M1 is always inactive or off while its gate is controlled to be at the high (VDD) level by the active DBufOffT signal, and consequently, there is no current flowing from MI to M2. Hence, the leakage between VPERBS and VNWBS at M1 and M2 is suppressed, and the overall current consumption is further effectively reduced.

Furthermore, in the standby state, the Low Vt p-MOS transistor M0 of the small swing driver 301 is set to VDD at its gate, and the Low Vt p-MOS transistor M3 of each of the small swing repeaters 302 and 303 is set to VNWBS at its gate. This further effectively suppresses the leakage of the standby current at the respective transistors M0 and M3. Additionally, the deactivated level shifter 304 has its output node coupled to VSS in the standby state.

Accordingly, in the apparatus 300 of the present embodiment, when in the standby state (e.g., DBufOffT and DBufOffF signals are active (VDD and VSS, respectively)): in the small swing driver 301, VDD and VPERBS are applied to the gate and the source of the Low p-MOS transistor M0, respectively, and VNWBS is applied to the Low p-MOS transistor M0 as its backbias voltage; and in each of the small swing repeaters 302 and 303, VPERBS and VNWBS are applied to the source and the gate of the Low p-MOS transistor M3, respectively, and VNWBS is also applied to the Low p-MOS transistor M3 as its backbias voltage. This way, the leak current at M0 in the small swing driver 301 and the leak current at M3 in the small swing repeaters 302 and 303 can be managed to reduce the current consumption during the standby state. Furthermore, in each of the small swing repeaters 302 and 303, the additional Low p-MOS transistor MI is provided and its gate is controlled by DBufOffT set to high (VDD). This way, the leak current at M1 (thereby at M2) can be managed during the standby state. And, the applications of VDD, VPERBS, and VNWBS to the other appropriate transistors in the small swing driver 301 and the small swing repeaters 302 and 303 as described herein also contribute to the effective reduction of the overall current consumption.

In still some embodiments, a timer circuit may be provided to turn off the small swing driver 301 when a write/read command does not come for a certain period of time. The timer circuit may be provided for each bank group. Bank groups that are not being used may be turned off. Also, there may be an active regulator circuit for VPERBS provided for each of the repeater circuits. The active regulator circuit may be turned off to reduce a tail current.

Figure 5:
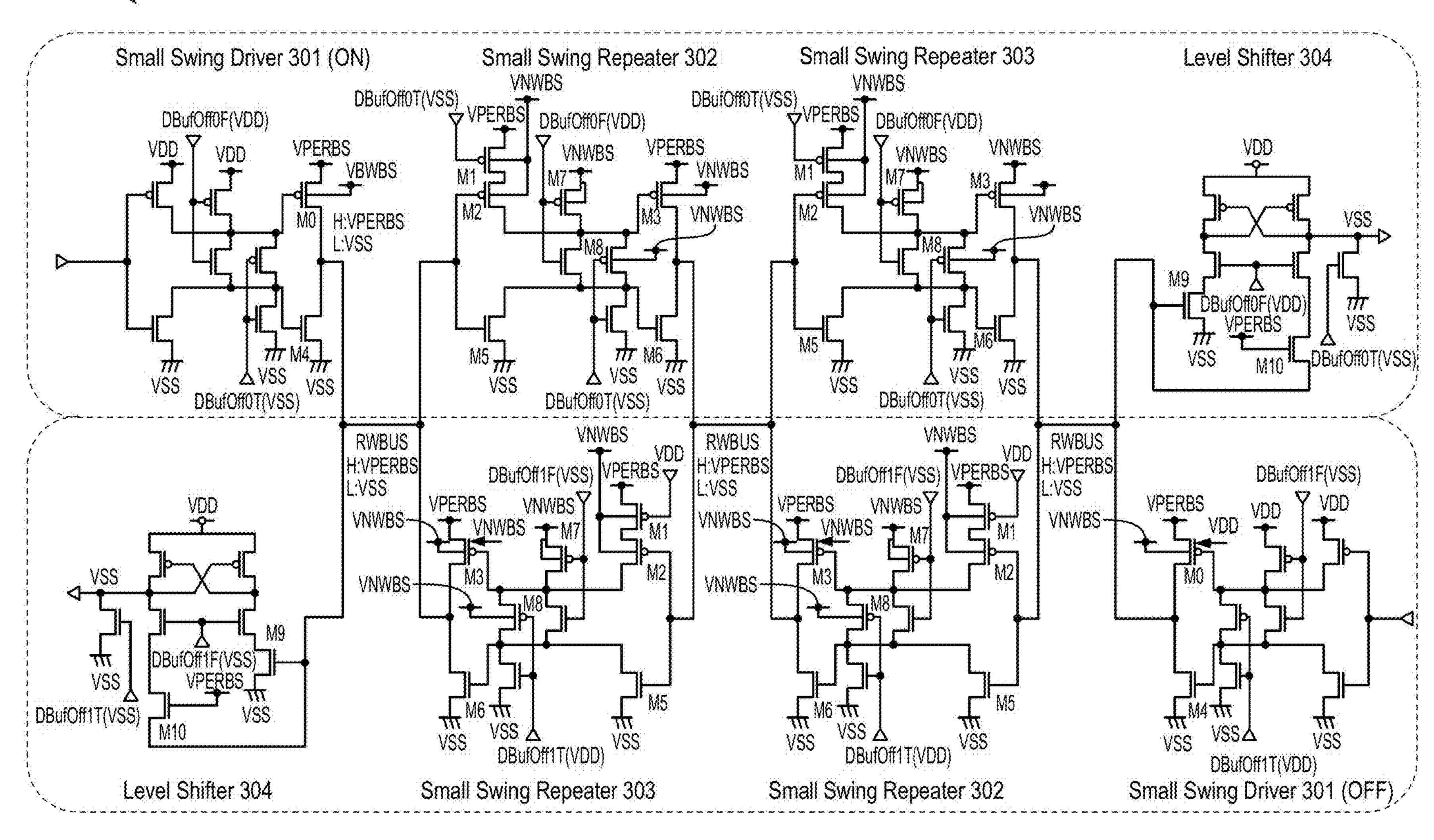
FIG. 5 is a circuit diagram of an example of an apparatus according to an embodiment of the disclosure.

FIG. 5 is a circuit diagram of an example of an apparatus 500 according to an embodiment of the disclosure. While the apparatus 300 of FIGS. 3 and 4 provides a single-directional buffer, the apparatus 500 of FIG. 5 provides a bi-directional buffer. In some embodiments of the disclosure, the apparatus 500 may be included in a core die CD of a memory device, for example, memory device 100 of FIG. 1. In some embodiments of the disclosure, the apparatus 500 may be included in one or more IO signal paths, for example, IO signal paths 201 of FIG. 2.

The bi-directional buffer includes a pair of small swing drivers, small swing repeaters, and shifters arranged in two directions, one for the data read operation and another for the data write operation. The same RWBUS is shared by the pair and used for both read and write operations. In the example, the small swing driver, the small swing repeaters, and the level shifter are the same as the small swing driver 301, the small swing repeaters 302 and 303, and the level shifter 304 of the apparatus 300. One set or one single-directional buffer (illustrated in the upper bank in the drawing) sends data via RWBUS in one direction (from the left side to the right side in the drawing) for one of the read and write operations, and another set or another single-directional buffer (illustrated in the lower bank in the drawing) sends data via the same RWBUS in another direction (from the right side to the left side in the drawing) for another of the read and write operations. The bi-directional buffer is also effective in reducing the current consumption as well as reducing the number of RWBUS.

In the active state of the bi-directional buffer, one of the small swing drivers 301 is activated and another of the small swing drivers 301 is deactivated. In the standby state, both of the small swing drivers 301 are deactivated. The illustrated example is of the active state where one small swing driver 301 in one direction (in the upper bank in the drawing) is activated and another small swing driver 301 in another direction (in the lower bank in the drawing) is deactivated during one of the read and write operations (for example, the read operation). During another of the read and write operations (for example, the write operation), the activated and deactivated states are reversed. The configurations of the circuits and the manners of the gate control, source/drain control, and backbias control using VDD, VSS, VPERBS and VNWBS at the transistors are the same as those for the apparatus 300 in the active state and the standby state, except that the one side receives control signals DBufOff0T and DBufOff0F and the other side receives control signals DBufOff1T and DBufOff1F. These control signals may be output by taking a logic of a signal output from a timer circuit and a write/read state signal from an external circuit. The state of each of DBufOff0T/DBufOff0F and DBufOff1T/DBufOff1F being high (VDD) or low (VSS) in each state is the same or substantially the same as that for the apparatus 300.

Figure 6:
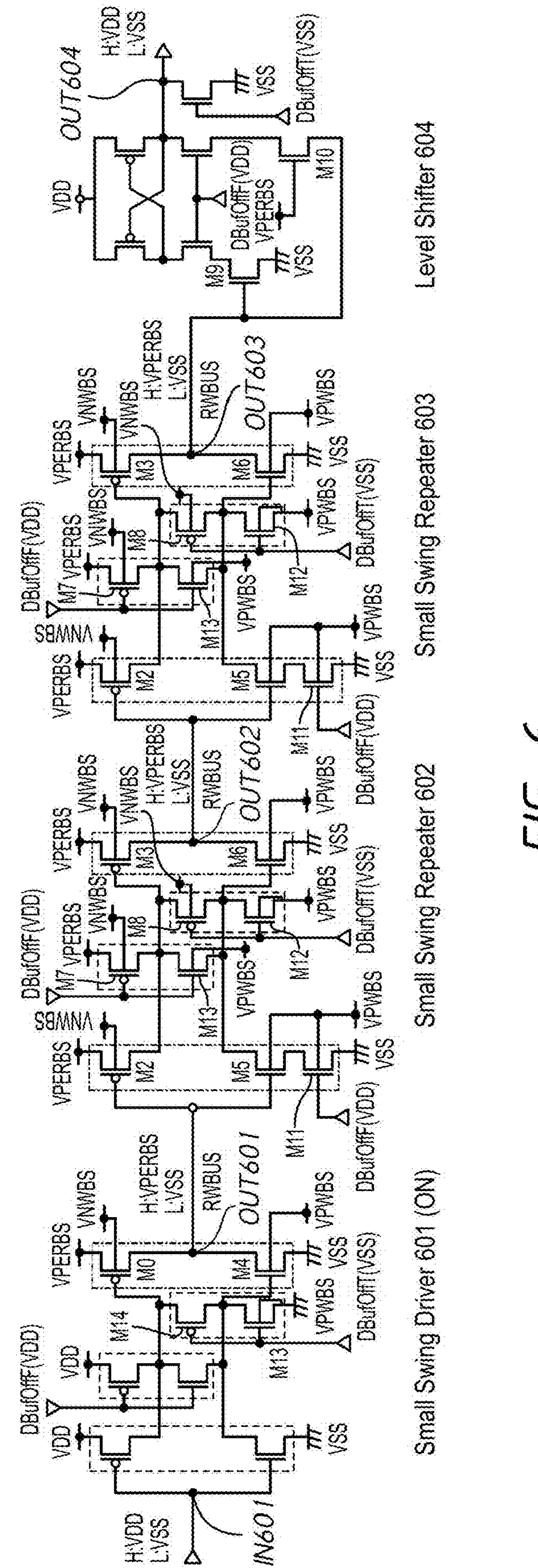
FIGS. 6 and 7 are circuit diagrams of an example of an apparatus according to an embodiment of the disclosure.
Figure 7:
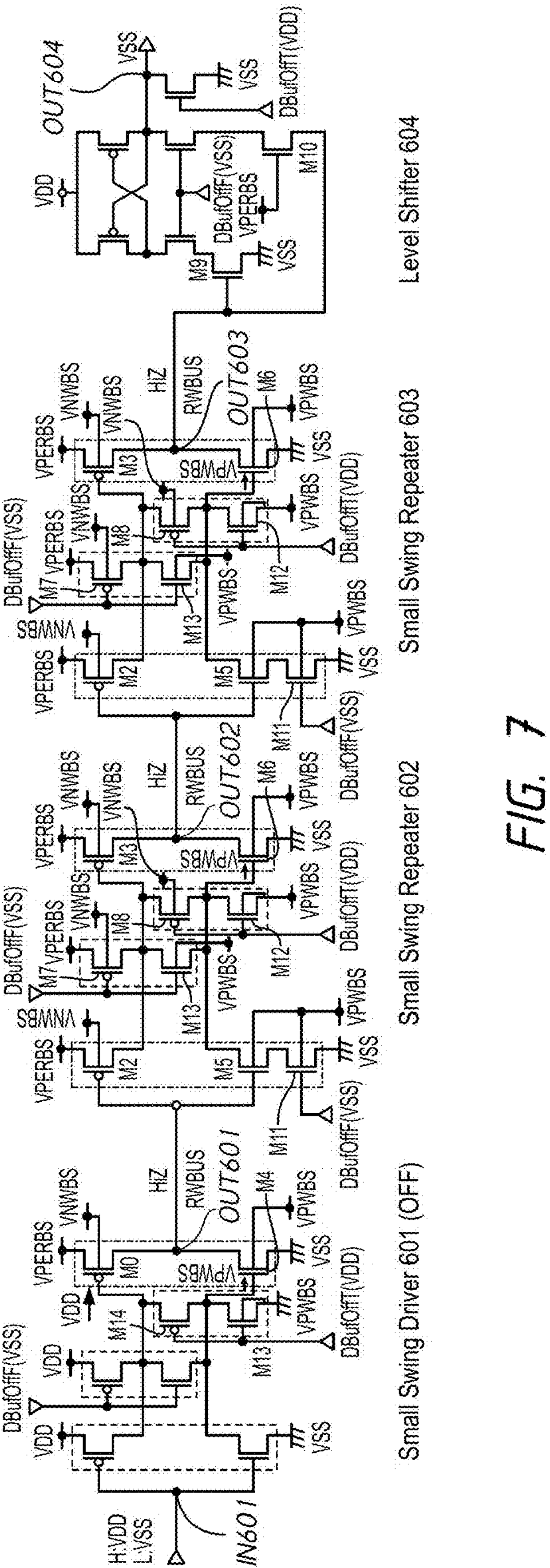

The embodiments and examples as described above achieve the effective reduction of the current consumption at the p-MOS transistor side. A similarly effective reduction can be achieved at the n-MOS transistor side. FIGS. 6 and 7 are circuit diagrams of an example of an apparatus 600 according to an embodiment of the disclosure. In some embodiments of the disclosure, the apparatus 600 may be included in a core die CD of a memory device, for example, memory device 100 of FIG. 1. In some embodiments of the disclosure, the apparatus 600 may be included in one or more IO signal paths, for example, IO signal paths 201 of FIG. 2.

The example circuit diagram in FIG. 6 is of an active state (or an active mode), and the example circuit diagram in FIG. 7 is of a standby state (or a standby mode). The apparatus 600 includes a small swing driver 601, a first small swing repeater 602, a second swing swift repeater 603, and a level shifter 604, which have different circuit configurations from the small swing driver 301, the first and second small swing repeaters 302 and 303, and the level shifter 304 of the apparatus 300 in that each of the small swing repeaters 602 and 603 has a Low Vt n-MOS transistor M11 coupled to the Low Vt n-MOS transistor M5, instead of the Low Vt p-MOS transistor M1 of the small swing repeaters 302 and 303 and that there are some different wirings of the transistors for the current consumption reduction at the n-MOS transistor side instead of the p-MOS transistor side.

Also, the apparatus 600 uses another power supply voltage (herein may also be referred to as $V_{pwell\text{-}bus}$ or VPWBS) stepped down from VSS. For example, VPWBS may be −0.3V while VSS may be 0V. VDD, VPERBS, and VNWBS may be the same as those for the apparatus 300, which may be, for example, 1.1V, 0.6V, and 0.9V, respectively. VPWBS is applied to each of the Low Vt n-MOS transistors M5, M6, and M11 as a backbias voltage in the small swing repeaters 602 and 603. VPWBS is also applied to the Normal Vt n-MOS transistors M12 at its source and as its backbias voltage. VPWBS may also be applied to the Normal Vt n-MOS transistor M13 of the small swing driver 601 at its source and as its backbias voltage.

In the active state, the DBufOffT and DBufOffF signals are inactive (e.g., VSS and VDD, respectively), and the inactive DBufOffT and DBufOffF signals activate the small swing driver 601, the first and second small swing repeaters 602 and 603, and the level shifter 604.

When activated, the small swing driver 601 provides an output signal from node OUT601 on the RWBUS having an output voltage based on a logic level of the input signal at node IN601. For example, for an input signal at node IN601 having a high logic level, the small swing driver 601 provides a high logic level output signal at node OUT601 having a voltage of VPERBS; for an input signal at node IN601 having a low logic level, the small swing driver 601 provides a low logic level output signal at node OUT601 having a voltage of VSS. The voltage of a high logic level output signal at node OUT601 is lower than the voltage of a high logic level input signal at node IN601 (e.g., VPERBS<VDD), which provides a lower voltage swing between high and low logic levels of the output signal at node OUT601 compared to the voltage swing of the input signal at node IN601.

When activated, the first small swing repeater 602 provides an output signal at an output node OUT602 on the RWBUS having an output voltage based on a logic level of the output signal at node OUT601 from the small swing driver 601. For example, for an output signal at node OUT601 having a high logic level, the first small swing repeater 602 provides a high logic level output signal at node OUT602 having a voltage of VPERBS; for an output single at node OUT601 having a low logic level, the first small swing repeater 602 provides a low logic level output signal at node OUT602 having a voltage of VSS. The voltage of a high logic level output signal at node OUT602 is the same as the voltage of a high logic level output signal at node OUT601 (e.g., VPERBS), which maintains the lower voltage swing between high and low logic levels of the output signal at node OUT602.

The second small swing repeater 603 operates similarly to the first small swing repeater 602, providing an output signal at node OUT603 having a logic level based on the output signal at node OUT602 provided by the first small swing repeater 602. As with the first small swing repeater 602, the second small swing repeater 603 provides a high logic level output signal at node OUT603 having a voltage of VPERBS, and provides a low logic level output signal at node OUT603 having a voltage of VSS. In the small swing repeaters 602 and 603, the Low Vt p-MOS transistor M11 is always active or on while receiving an inactive DBufOffF (high: VDD) at its gate.

The level shifter 604 receives the output signal at node OUT603, and when activated, provides an output signal having a logic level based on the output signal at node OUT603 from the second small swing repeater 603. The level shifter 604 provides a high logic level output signal at node OUT604 having a voltage VDD when the output signal at node OUT603 has a high logic level (e.g., VPERBS voltage), and provides a low logic level output signal at node OUT604 having a voltage VSS when the output signal at node OUT303 has a low logic level (e.g., VSS voltage). As a result, an input signal at node IN601 provided to the small swing driver 601 having a voltage swing of VDD and VSS is transmitted over the RWBUS by the first and second small swing repeaters 603 and 603 with a lower voltage swing of VPERBS and VSS, and is then shifted to a higher voltage swing of VDD and VSS when output as the output signal at node OUT604 by the level shifter 604.

In the standby state, the DBufOffT and DBufOffF signals are active (e.g., VDD and VSS, respectively), and the active DBufOffT and DBufOffF signals deactivate the small swing driver 601, the first and second small swing repeaters 602 and 603, and the level shifter 304. When the small swing driver 601 is deactivated, there may be a leak current that flows between the Low Vt p-MOS transistor M0 and the Low Vt n-MOS transistor M4. To reduce the off-leakage, VPWBS (e.g., −0.3V) is applied at a gate and as a backbias voltage of M4. This way, the leakage at M4 is effectively suppressed. Additionally, VDD (e.g., 1.1V) may be applied at a gate of M0 to suppress the leakage at MO. The combination of the application of VDD at the p-MOS transistor side and VPWBS at the n-MOS transistor side further effectively achieves the suppression of the off-leakage at the pair of M0 and M4.

In addition, when deactivated, the small swing driver 601, and the first and second small swing repeaters 602 and 603 have a high-impedance state (HiZ) at the respective output nodes. That is, RWBUS becomes HiZ. In such a state, VPWBS may leak at the Low Vt p-MOS transistor M5, which causes an increase of the standby current. However, in the circuit configuration according to the present embodiment, the Low Vt p-MOS transistor M11 is always inactive or off while its gate is controlled to be at the low (VSS) level by the active DBufOffF signal, and consequently, there is no current flowing from M11 to M5, thereby further effectively reducing the overall current consumption.

Furthermore, in the standby state, the Low Vt p-MOS transistor M4 of the small swing driver 601 is set to VPWBS at its gate, and the Low Vt p-MOS transistor M6 of each of the small swing repeaters 602 and 603 is also set to VPWBS at its gate. This further effectively suppresses the leakage of the standby current at the respective transistors M4 and M6. Additionally, the deactivated level shifter 604 has its output node coupled to VSS.

Accordingly, in the apparatus 600 of the present embodiment, when in the standby state (e.g., DBufOffT and DBufOffF signals are active (VDD and VSS, respectively)): in the small swing driver 601, VSS and VPWBS are applied to the source and the gate of the Low n-MOS transistor M4, respectively, and VPWBS is also applied to M4 as its backbias voltage; and in each of the small swing repeaters 602 and 603, VSS and VPWBS are applied to the source and the gate of the Low n-MOS transistor M6, respectively, and VPWBS is also applied to M6 as its backbias voltage. This way, the leak current at M4 in the small swing driver 601 and the leak current at M6 in the small swing repeaters 602 and 603 can be managed to reduce the current consumption during the standby state at the n-MOS transistor side of the driver/repeater circuits. Furthermore, in each of the small swing repeaters 602 and 603, the additional Low p-MOS transistor M11 is provided and its gate is controlled by DBufOffT set to low (VSS). This way, the leak current at M11 (thereby at M5) can be managed during the standby state. And, the applications of VSS and VPWBS to the other appropriate transistors in the small swing driver 601 and the small swing repeaters 602 and 603 as described herein also contribute to the effective reduction of the overall current consumption.

Still furthermore, the apparatus 600 may be used to provide a bi-directional buffer in a similar manner to the apparatus 500 of FIG. 5. The bi-directional buffer includes a pair of the small swing drivers 601, the small swing repeaters 602 and 603, and the level shifters 604 arranged in two directions, one for the data read operation and another for the data write operation. The same RWBUS is shared by the pair and used for both read and write operations. Such bi-directional buffer is also effective in reducing the current consumption at the n-MOS transistor side and reducing the number of RWBUS.

Figure 8:
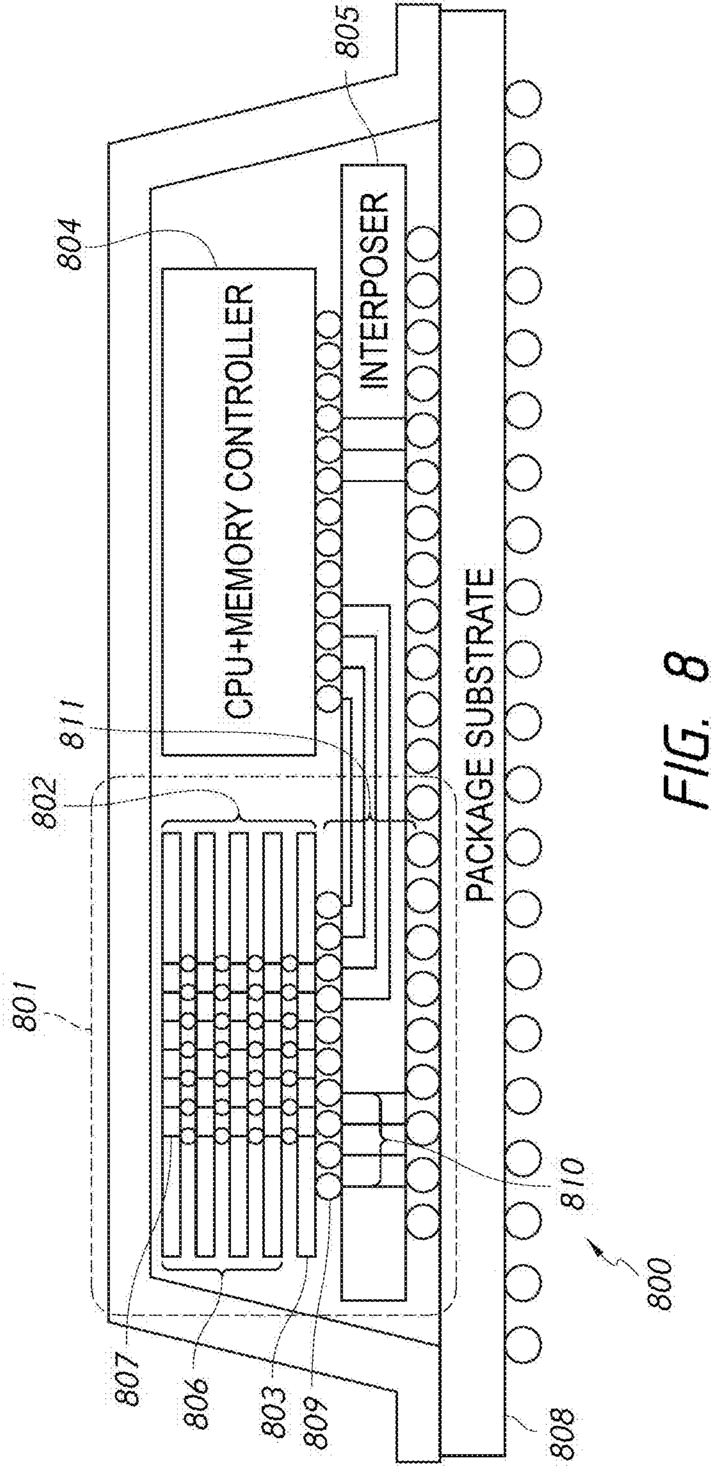
FIG. 8 depicts a schematic configuration of an example semiconductor system according to an embodiment of the disclosure.

FIG. 8 depicts a schematic configuration of an example semiconductor system 800 according to an embodiment of the disclosure. The semiconductor system 800 includes a semiconductor memory device 801 in an embodiment of the disclosure. In some embodiments of the disclosure the semiconductor memory device 801 may include the memory device 100. In some embodiments of the disclosure, the semiconductor memory device 801 may include one or more of apparatuses 300, 500, and/or 600 previously described. The semiconductor system 800 may also include a central processing unit (CPU) and memory controller 804, which may be a controller chip, on an interposer 805 on a package substrate 808. The interposer 805 may include one or more power lines 810 which may supply power supply voltage from the package substrate 808. The interposer 805 may include a plurality of channels 811 that may interconnect the CPU and memory controller 804 and the semiconductor memory device 801. The semiconductor memory device 801 may be a dynamic random access memory (DRAM). The memory controller 804 may provide a clock signal, a command signal, and may further transmit and receive data signals. The plurality of channels 811 may transmit the data signals between the memory controller and the memory device 801.

The semiconductor memory device 801 may include a plurality of dies (or chips) 802 including at least one interface (IF) die (or chip) 803 and a plurality of memory core dies (or chips) 806 stacked with each other. A number of the memory core dies 806 may not be limited to four as in the illustrated example, and may be more or fewer as appropriate. Each of the memory core dies 806 may include a plurality of memory cells and circuitries accessing the memory cells. For example, the memory cells may be DRAM cells. The memory cells may be arranged in array. The semiconductor memory device 801 may include conductive vias 807 which couple the IF die 803 and the memory core dies 806 by penetrating the IF die 803 and the memory core dies 806. The IF die 803 may be coupled to the interposer 805 via interconnects 809. For example, the interconnects 809 may be microbumps having bump pitches of less than about or less than one hundred micrometers and exposed on an outside of the IF die 803. A portion of each of the interconnects 809 may be coupled to the one or more power lines 810. Another portion of each of the interconnects 809 may be coupled to one or more of the channels 811.

DRAM is merely one example, and the embodiments and the descriptions herein are not intended to be limited to DRAM. Memory devices other than DRAM, such as a static random-access memory (SRAM), a flash memory, an erasable programmable read-only memory (EPROM), a magnetoresistive random-access memory (MRAM), and a phase-change memory, can also be applied as the memory device 801. Furthermore, devices other than memory, including logic ICs, such as a microprocessor and an application-specific integrated circuit (ASIC), are also applicable as the semiconductor device according to the present embodiments.

Figure 9:
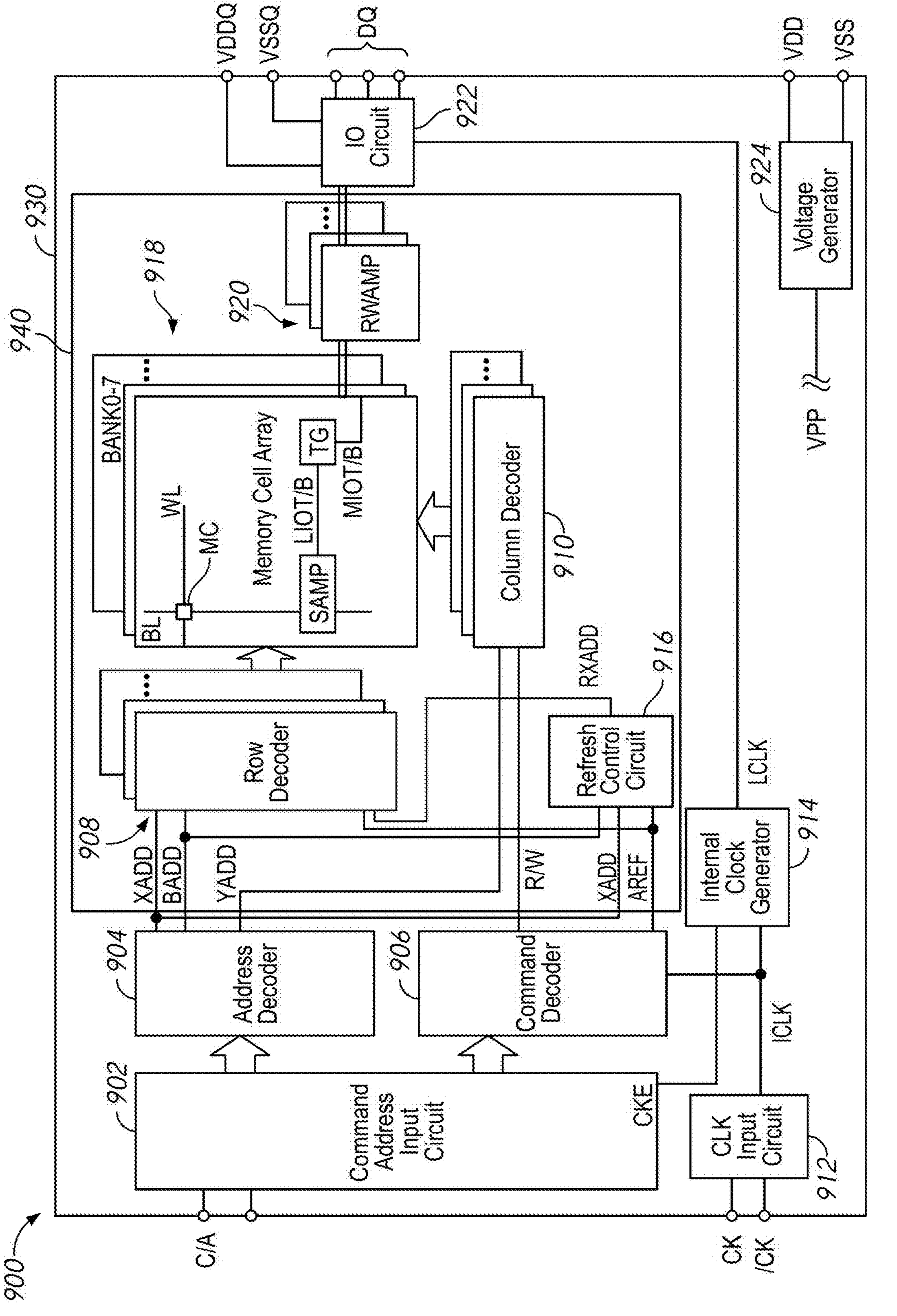
FIG. 9 is a block diagram of an example semiconductor system according to an embodiment of the disclosure.

FIG. 9 is a block diagram of an example semiconductor device 900 according to an embodiment of the disclosure. The semiconductor device 900 may be a semiconductor memory device, such as a DRAM device. In some embodiments of the disclosure, the semiconductor device 900 is included in a semiconductor memory device, for example, the semiconductor memory device 801 of FIG. 8. The DRAM device may include an interface die and a plurality of core dice which are stacked on the interface die. In the example diagram of FIG. 9, certain components are shown located on an interface die 930, while other components are shown as part of each of a core dice 940. For the sake of clarity, only a single core die 940 and its components are shown, however, there may be multiple core dies (e.g., 2, 4, 6, 8, 16, or more) each with similar components to each other. The example semiconductor device 900 of FIG. 9 shows a particular arrangement of components between the interface die 930 and the core die 940, however other arrangements may be used in other embodiments (e.g., a refresh control circuit 916 may be on the interface die 930 in some embodiments). For the sake of illustration, the core die 940 is drawn as a box which is smaller than the interface die 930, however the core die 940 and interface die 930 may have any size relationship to each other. For example, the core die 940 and interface die 930 may be approximately the same size.

The semiconductor device 900 includes a memory array 918 on each of the core dice 140. The memory array 918 is shown as including a plurality of memory banks. In the embodiment of FIG. 9, the memory array 918 is shown as including eight memory banks BANK0-BANK7. More or fewer banks may be included in the memory array 918 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 908 and the selection of the bit lines BL is performed by a column decoder 910, each of which may also be located on each of the core dice. In the embodiment of FIG. 9, the row decoder 908 includes a respective row decoder for each memory bank and the column decoder 910 includes a respective column decoder for each memory bank. The bit lines BL are coupled to a respective sense amplifier (SAMP) of the memory array 918. Read data from the bit line BL is amplified by the sense amplifier SAMP, and transferred to read/write amplifiers (RWAMPs) 920 over complementary local data lines (LIOT/B), transfer gate (TG), and complementary main data lines (MIOT/B) which are coupled to RWAMP 920. Conversely, write data outputted from RWAMP 920 is transferred to the sense amplifier SAMP over the complementary main data lines MIOT/B, the transfer gate TG, and the complementary local data lines LIOT/B, and written in the memory cell MC coupled to the bit line BL.

The semiconductor device 900 may employ a plurality of external terminals located on the interface die 930 that include command and address (C/A) terminals coupled to a command and address bus to receive commands and addresses, and a CS signal, clock terminals to receive clocks CK and/CK, data terminals DQ to provide data, and power supply terminals to receive power supply potentials VDD, VSS, VDDQ, and VSSQ.

The clock terminals on the interface die 930 are supplied with external clocks CK and /CK that are provided to an input circuit 912. The external clocks may be complementary. The input circuit 912 generates an internal clock ICLK based on the CK and /CK clocks. The ICLK clock is provided to the command decoder 906 and to an internal clock generator 914. The internal clock generator 914 provides various internal clocks LCLK based on the ICLK clock. The LCLK clocks may be used for timing operation of various internal circuits. The internal data clocks LCLK are provided to an input/output (I/O) circuit 922 to time operation of circuits included in the I/O circuit 922, for example, to data receivers to time the receipt of write data.

The internal clocks LCLK may include a read clock (RCLK) which is used to control the timing of read operations, and write clock (WCLK) which is used to control the timing of write operations. The internal clocks may be passed both to the I/O circuits 922 and also to internal components of the core dice 940 such as RWAMP 920.

The C/A terminals may be supplied with memory addresses. The memory addresses supplied to the C/A terminals are transferred, via a command/address input circuit 902, to an address decoder 104. The address decoder 104 receives the address and supplies a decoded row address XADD to the row decoder 908 and supplies a decoded column address YADD to the column decoder 910. The address decoder 104 may also supply a decoded bank address BADD, which may indicate the bank of the memory array 918 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to the command decoder 906 via the command/address input circuit 902. The command decoder 906 includes circuits to decode the internal command signals to generate various internal signals and commands for performing operations. For example, the command decoder 906 may provide a row command signal to select a word line and a column command signal to select a bit line.

The semiconductor device 900 may receive an access command which is a read command. When a read command is received, and a bank address, a row address and a column address are timely supplied with the read command, read data is read from memory cells in the memory array 918 corresponding to the row address and column address. The read command is received by the command decoder 906, which provides internal commands so that read data from the memory array 918 is provided to RWAMP 920. The read data is output to outside the semiconductor device 900 from the data terminals DQ via the I/O circuit 922.

The semiconductor device 900 may receive an access command which is a write command. When the write command is received, and a bank address, a row address and a column address are timely supplied with the write command, and write data is supplied through the DQ terminals to RWAMP 920. The write data supplied to the data terminals DQ is written to a memory cells in the memory array 918 corresponding to the row address and column address. The write command is received by the command decoder 906, which provides internal commands so that the write data is received by data receivers in the I/O circuit 922. Write clocks may also be provided to the external clock terminals for timing the receipt of the write data by the data receivers of the I/O circuit 922. The write data is supplied via the I/O circuit 922 to RWAMP 920.

The semiconductor device 900 may also receive commands causing it to carry out one or more refresh operations as part of a self-refresh mode. In some embodiments, the self-refresh mode command may be externally issued to the semiconductor device 900. In some embodiments, the self-refresh mode command may be periodically generated by a component of the device. In some embodiments, when an external signal indicates a self-refresh entry command, the refresh signal AREF may also be activated.

The power supply terminals are supplied with power supply potentials VDD and VSS. The power supply potentials VDD and VSS are supplied to an internal voltage generator circuit 924. The internal voltage generator circuit 924 generates various internal potentials such as VPP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the I/O circuit 922. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the I/O circuit 922 so that power supply noise generated by the I/O circuit 922 does not propagate to the other circuit blocks.

Although various embodiments of the disclosure have been described in detail, it will be understood by those skilled in the art that embodiments of the disclosure may extend beyond the specifically described embodiments to other alternative embodiments and/or uses and modifications and equivalents thereof. In addition, other modifications which are within the scope of the disclosure will be readily apparent to those of skill in the art based on the described embodiments. It is also contemplated that various combination or sub-combination of the specific features and aspects of the embodiments may be made and still fall within the scope of the disclosure. It should be understood that various features and aspects of the embodiments can be combined with or substituted for one another in order to form varying mode of the embodiments. Thus, it is intended that the scope of the disclosure should not be limited by the particular embodiments described above.

What is claimed is:

1. An apparatus, comprising:

a driver on a data transfer wiring of a memory device and including a first pair of first-type p-MOS and n-MOS transistors and a second pair of second-type p-MOS and n-MOS transistors; and a repeater on the data transfer wiring of the memory device and including a third pair of the first-type p-MOS and n-MOS transistors and a fourth pair of the second-type p-MOS and n-MOS transistors, wherein in the driver, a positive power supply voltage and a first step-down power supply voltage are applied to a gate and a source of the second-type p-MOS transistor of the second pair, respectively, and a second step-down power supply voltage is applied to the second-type p-MOS transistor of the second pair as a backbias voltage, the second step-down power supply voltage having a voltage value greater than the first step-down supply voltage and less than the positive power supply voltage, and in the repeater, the first step-down power supply voltage and the second step-down power supply voltage are applied to a source and a gate of the second-type p-MOS transistor of the fourth pair, respectively, and the second step-down power supply voltage is also applied to the second-type p-MOS transistor of the fourth pair as a backbias voltage.

2. The apparatus according to claim 1, wherein in the driver, the gate of the second-type p-MOS transistor is controlled using the positive power supply voltage during a standby state, and in the repeater, the gate of the second type p-MOS transistor is controlled using the second step-down power supply voltage during the standby state.

3. The apparatus according to claim 1, wherein in the repeater, the second step-down power supply voltage is also applied to the first-type p-MOS transistor of the first pair at a source thereof and as a backbias voltage thereof.

4. The apparatus according to claim 1, wherein the repeater further includes a fifth pair of the second-type p-MOS and n-MOS transistors and an additional second-type p-MOS transistor coupled to the second-type p-MOS transistor of the fifth pair, and the positive power supply voltage and the first step-down power supply voltage are applied to a gate and a source of the additional second-type p-MOS transistor, respectively, and the second step-down power supply voltage is applied to the additional second type p-MOS transistor as a backbias voltage.

5. The apparatus according to claim 4, wherein the gate of the additional second-type p-MOS transistor is controlled using the positive power supply voltage during a standby state.

6. The apparatus according to claim 4, wherein the fifth pair of the second-type p-MOS and n-MOS transistors is arranged on an upstream side before the third pair of the first-type p-MOS and n-MOS transistors.

7. The apparatus according to claim 1, wherein the second-type p-MOS and n-MOS transistors each have a lower threshold voltage than the first-type p-MOS and n-MOS transistors.

8. The apparatus according to claim 1, wherein the data transfer wiring is used for data transfer during one or both of a data read operation and a data write operation of the memory device.

9. The apparatus according to claim 1, wherein the data transfer wiring includes at least one of a data read bus, a data write bus, and a data read and write bus of the memory device.

10. The apparatus according to claim 1, wherein the data transfer wiring are arranged between a through-silicon via in a peripheral region and a memory bank group in a cell array region.

11. The apparatus according to claim 1, further comprising a level shifter coupled to the data transfer wiring at a downstream side after the repeater, wherein the level shifter is configured to transition the data transfer wiring back to the positive power supply voltage.

12. The apparatus according to claim 1, wherein the repeater includes a plurality of repeaters arranged in series.

13. An apparatus, comprising:

a driver on a data transfer wiring of a memory device and including a first pair of first-type p-MOS and n-MOS transistors and a second pair of second-type p-MOS and n-MOS transistors; and a repeater on the data transfer wiring of the memory device and including a third pair of the first-type p-MOS and n-MOS transistors and a fourth pair of the second-type p-MOS and n-MOS transistors, wherein in the driver, a ground power supply voltage and a step-down power supply voltage are applied to a source and a gate of the second-type n-MOS transistor of the second pair, respectively, and the step-down power supply voltage is also applied to the second-type n-MOS transistor of the second pair as a backbias voltage, the step-down power supply voltage having a voltage value less than the ground power supply voltage, and in the repeater, the ground power supply voltage and the step-down power supply voltage are applied to a source and a gate of the second-type n-MOS transistor of the fourth pair, respectively, and the step-down power supply voltage is also applied to the second-type n-MOS transistor of the fourth pair as a backbias voltage.

14. The apparatus according to claim 13, wherein in the driver, the gate of the second-type n-MOS transistor is controlled using the step-down power supply voltage during a standby state, and in the repeater, the gate of the second type n-MOS transistor is controlled using the step-down power supply voltage during the standby state.

15. The apparatus according to claim 13, wherein the repeater further includes a fifth pair of the second-type p-MOS and n-MOS transistors and an additional second-type n-MOS transistor coupled to the second-type n-MOS transistor of the fifth pair, the ground power supply voltage and the step-down power supply voltage are applied to the additional second type p-MOS transistor at a source thereof and as a backbias voltage thereof, respectively, and the gate of the additional second-type p-MOS transistor is controlled using the ground power supply voltage.

16. The apparatus according to claim 15, wherein the fifth pair of the second-type p-MOS and n-MOS transistors is arranged on an upstream side of the third pair of the first-type p-MOS and n-MOS transistors.

17. The apparatus according to claim 13, wherein the second-type p-MOS and n-MOS transistors each have a lower threshold voltage than the first-type p-MOS and n-MOS transistors.

18. The apparatus according to claim 13, wherein the data transfer wiring includes at least one of a data read bus, a data write bus, and a data read and write bus arranged between a through-silicon via in a peripheral region and a memory bank group in a cell array region of the memory device.

19. The apparatus according to claim 13, further comprising a level shifter coupled to the data transfer wiring at a downstream side after the repeater, wherein the level shifter is configured to transition the data transfer wiring back to the ground power supply voltage.

20. An apparatus, comprising:

a driver on a data transfer wiring of a memory device and including a first pair of first-type p-MOS and n-MOS transistors and a second pair of second-type p-MOS and n-MOS transistors; and a plurality of repeaters on the data transfer wiring of the memory device, each of the repeaters including a third pair of the first-type p-MOS and n-MOS transistors and a fourth pair of the second-type p-MOS and n-MOS transistors, wherein the second-type p-MOS and n-MOS transistors each have a lower threshold voltage than the first-type p-MOS and n-MOS transistors, the driver is configured to control a gate of the second-type p-MOS transistor of the second pair using a positive power supply voltage during a standby state or configured to control a gate of the second-type n-MOS transistor of the second pair using a power supply voltage stepped down from a ground power supply voltage, and each of the repeaters is configured to control a gate of the second-type p-MOS transistor of the fourth pair using a power supply voltage stepped down from the positive power supply during the standby state or configured to control a gate of the second-type n-MOS transistor of the fourth pair using a power supply voltage stepped down from a ground power supply voltage.

* * * * *